United States Patent
Huang et al.

(10) Patent No.: US 9,466,678 B2
(45) Date of Patent: Oct. 11, 2016

(54) SEMICONDUCTOR DEVICE AND MANUFACTURING METHOD THEREOF

(71) Applicant: UNITED MICROELECTRONICS CORP., Hsin-Chu (TW)

(72) Inventors: Shih-Hsien Huang, Kaohsiung (TW); Che-Wei Chang, Taoyuan (TW); Chih-Chieh Yeh, Tainan (TW); Tzu-I Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/613,343

(22) Filed: Feb. 3, 2015

(65) Prior Publication Data
US 2016/0181383 A1 Jun. 23, 2016

(30) Foreign Application Priority Data
Dec. 18, 2014 (CN) .......................... 2014 1 0794508

(51) Int. Cl.
| | |
|---|---|
| *H01L 21/00* | (2006.01) |
| *H01L 29/417* | (2006.01) |
| *H01L 29/66* | (2006.01) |
| *H01L 29/78* | (2006.01) |
| *H01L 29/45* | (2006.01) |
| *H01L 21/285* | (2006.01) |
| *H01L 21/302* | (2006.01) |
| *H01L 29/08* | (2006.01) |

(52) U.S. Cl.
CPC ... *H01L 29/41791* (2013.01); *H01L 21/28518* (2013.01); *H01L 21/302* (2013.01); *H01L 29/0847* (2013.01); *H01L 29/41758* (2013.01); *H01L 29/458* (2013.01); *H01L 29/665* (2013.01); *H01L 29/66636* (2013.01); *H01L 29/66795* (2013.01); *H01L 29/785* (2013.01)

(58) Field of Classification Search
CPC .................................................. H01L 21/41791
See application file for complete search history.

(56) References Cited

U.S. PATENT DOCUMENTS

| | | | |
|---|---|---|---|
| 7,514,309 B2 | 4/2009 | Sridhar et al. | |
| 7,608,515 B2 | 10/2009 | Chen et al. | |
| 7,927,989 B2 | 4/2011 | Zhang et al. | |
| 8,415,718 B2 | 4/2013 | Xu | |
| 2008/0157208 A1* | 7/2008 | Fischer | H01L 21/76843 257/368 |
| 2008/0242032 A1 | 10/2008 | Chakravarthi et al. | |
| 2008/0277699 A1 | 11/2008 | Chakravarthi et al. | |
| 2012/0223364 A1* | 9/2012 | Chung | H01L 21/823807 257/192 |
| 2013/0087857 A1 | 4/2013 | Ko et al. | |

OTHER PUBLICATIONS

Hung, Title of Invention: Method for Fabricating Semiconductor Device, U.S. Appl. No. 14/455,939, filed Aug. 10, 2014.

* cited by examiner

*Primary Examiner* — William Harriston
(74) *Attorney, Agent, or Firm* — Winston Hsu; Scott Margo

(57) ABSTRACT

The present invention relates to a semiconductor device and a manufacturing method thereof. The semiconductor device includes a substrate, an epitaxial structure, and a recess. The epitaxial structure is disposed in the substrate. The recess is formed in the epitaxial structure, where the recess has a cross-section in a direction perpendicular to the substrate, and at least one portion of the recess is gradually expanded from an opening of the recess.

17 Claims, 5 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, a semiconductor device having an epitaxial structure with a recess and a manufacturing method thereof.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes, in which the contact plugs are composed of conducting metals such as tungsten and copper. Nevertheless, the interconnection between the contact plugs and the silicon material of the gate structure and the source/drain region is usually poor, hence a silicide material is often formed over the surface of the gate structure and the source/drain region to improve the ohmic contact between the contact plugs and the gate structure and the source/drain region.

However, current approach for forming silicide still encounters numerous problems. Hence, how to improve the current manufacturing process while increasing the performance of the device has become an important task in this field.

SUMMARY OF THE INVENTION

It is one of the primary objectives of the present invention to provide a novel semiconductor device, which has lower contact resistance (Rc) between the contact plug and the source/drain thereof, so as to achieve preferable efficiency.

It is another one of the primary objectives of the present invention to provide a manufacturing method of a semiconductor device, which can increase the contact area between the contact plug and the source/drain thereof, and reduce the contact resistance therebetween further.

To achieve the purpose described above, the present invention provides a semiconductor device including a substrate, an epitaxial structure and a recess. The epitaxial structure is disposed in the substrate. The recess is disposed in the epitaxial structure, wherein the recess has a cross-section along a direction perpendicular to the substrate and at least a portion of the cross-section is gradually expanded from an opening of the recess.

To achieve the purpose described above, the present invention further provides another semiconductor device including a substrate, an epitaxial structure and a recess. The epitaxial structure is disposed in the substrate. The recess is disposed in the epitaxial structure, wherein the recess has a depth being 30-70% of a height of the epitaxial structure.

To achieve the purpose described above, the present invention also provides a manufacturing method of a semiconductor device including following steps. First of all, a first recess is formed in a substrate. Then, an epitaxial structure is formed in the first recess. After this, a second recess is formed in the epitaxial structure, wherein the second recess has a cross-section along a direction perpendicular to the substrate and at least a portion of the cross-section is gradually expanded from an opening of the second recess.

Through the method of manufacturing the semiconductor device, the contact opening is formed in the dielectric layer firstly, and the recess is then formed in the epitaxial structure in fin-shaped structure (substrate) at two sides of the gate structure by penetrating through the contact opening during the contact opening etching process. Thus, the recess may have a cross-section gradually expanded from up to down, such that the silicide layer may be formed subsequently on the inner surface of the recess to dramatically reduce the resistance between the contact plug and the silicide layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
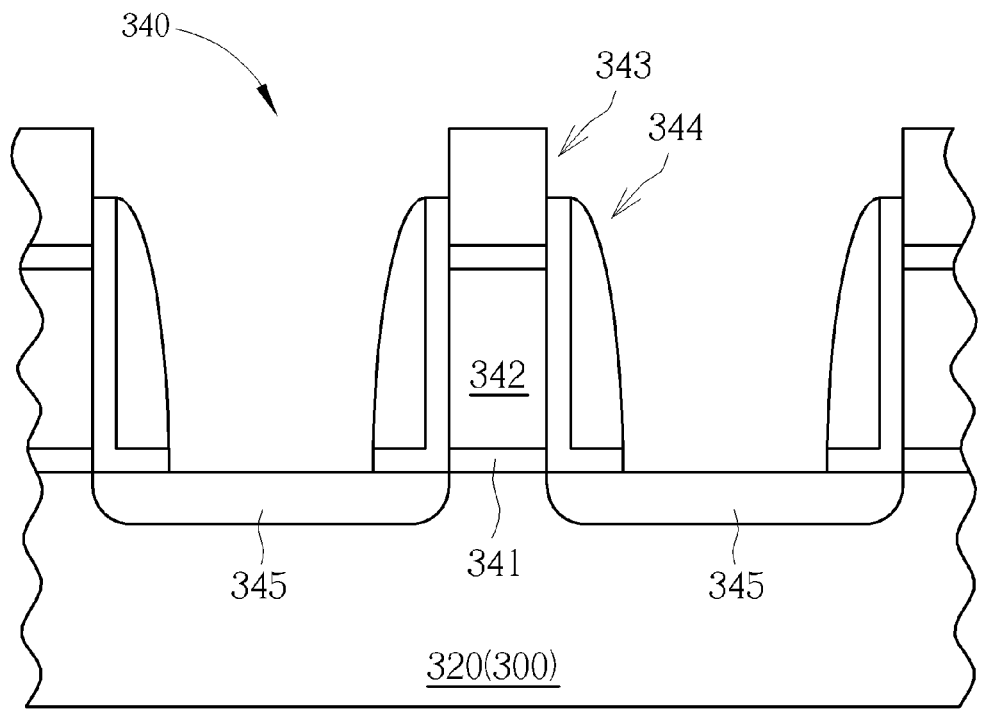
FIG. 1 to FIG. 6 are schematic diagrams illustrating a manufacturing method of a semiconductor device according to a first embodiment of the present invention.

Please refer to FIG. 1 to FIG. 6. FIG. 1 to FIG. 6 illustrate a manufacturing method of a semiconductor device in accordance with the first embodiment of the present invention. First of all, as shown in FIG. 1, a substrate 300 is provided; which may be a silicon substrate, an epitaxial silicon substrate, a silicon germanium substrate, a silicon carbide substrate or a silicon-on-insulator (SOI) substrate; and at least a gate structure 320 is formed on the substrate 300. In the present embodiment, at least a fin-shaped structure 320 and an insulation layer (not shown in the drawings) are firstly formed in the substrate 300, and the gate structure 340 is then formed on the fin-shaped structure 320. In one embodiment, the method of forming the fin-shaped structure may include firstly forming a patterned mask (not shown in the drawings) on the substrate 300, transferring patterns of the patterned mask to the substrate 300 through an etching process, and removing the patterned mask, to form a plurality of trenches (not shown in the drawings) in the substrate 300. After this, the insulation layer is then filled in the trenches, so that a portion of the substrate protruded from the insulation layer forms the fin-shaped structure 320 and the insulation layer forms shallow trench isolation. In another embodiment of the present invention, the fin-shaped structure may also be omitted while the formed transistor is a planar transistor, and the gate structure may be formed directly on the planar substrate.

In one embodiment of the present invention, the gate structure 340 includes an interfacial layer 341, a dummy gate 342, a capping layer 343, a spacer 344 and a light doped drain (LDD) region 345. The interfacial layer 341 may include silicon dioxide ($SiO_2$) or silicon nitride (SiN). The dummy gate 342 may include polysilicon, for example including undoped polysilicon, doped polysilicon, amorphous silicon or a composite material of the combination thereof. The capping layer 343 may be a multilayer structure, as shown in FIG. 1, for example including $SiO_2$, silicon carbide (SiC), SiN, oxynitride (SiON) or a composite material of the combination thereof, and in another embodiment, the capping layer 343 may also be a monolayer of the above mentioned materials, however. The spacer 344 may also be a monolayer structure or a multilayer structure optionally, for example including high temperature oxide (HTO), SiN, $SiO_2$, silicon, SiON or SiN formed by hexachlorodisilane ($Si_2Cl_6$) (HCD-SiN). In one embodiment of the present invention, the method of forming the gate structure 340 includes the following steps. First, an interfacial material layer (not shown in the drawings), a dummy gate material layer (not shown in the drawings) and a capping material layer (not shown in the drawings) are formed on the substrate 300, and then the stacked layers are patterned to form a gate stack structure (not shown in the drawings). Subsequently, the LDD region 345 is formed in the fin-shaped structure 320 (substrate 300) at two sides of the gate stack structure. Lastly, the spacer 344 is formed on sidewalls of the gate stack structure, thereby forming the gate structure 340. However, the method of forming the gate structure of the present invention is not limited to the above-mentioned steps but can include other methods which are well known by one skilled in the arts. Furthermore, although the gate structure 340 of the present embodiment is exemplified as a "gate-last" process and a "high-k last" process, in another embodiment, the gate structure may also be formed through other processes, such as directly forming a metal gate structure (not shown in the drawings) and the metal gate structure at least including a work function layer and a metal gate.

Figure 2:
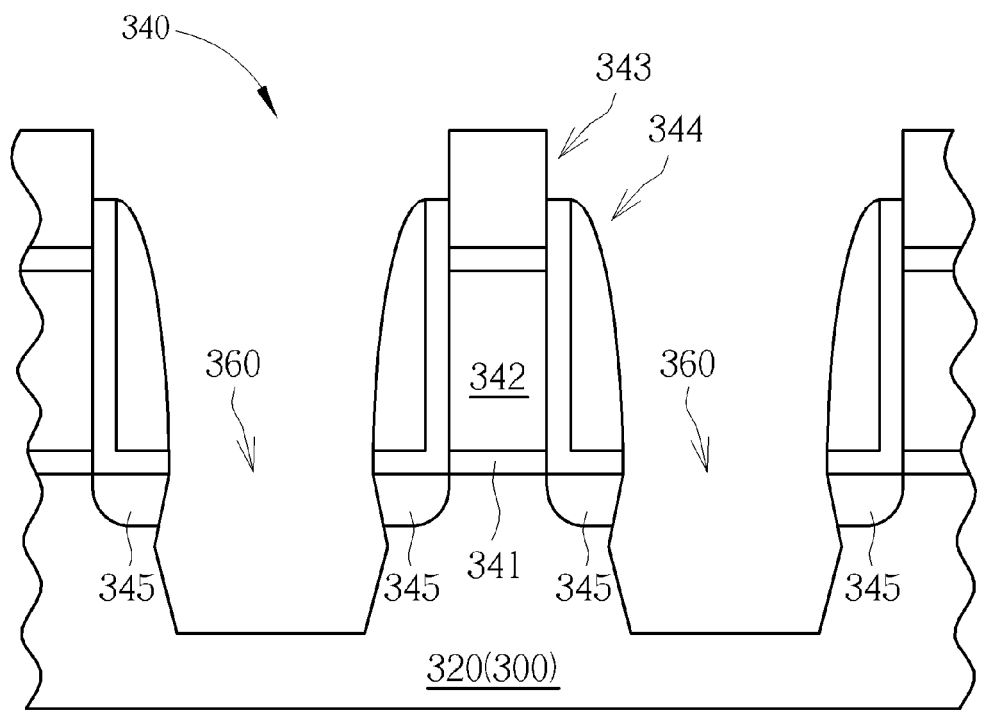

Next, as shown in FIG. 2, an etching process is performed to form a recess 360 in the substrate 300 at two sides of the gate structure 340 in the fin-shaped structure 320 (substrate 300). For example, a dry etching process can first be performed to form a primary recess (not shown in the drawings) at two sides of the gate structure 340 in the fin-shaped structure 320 (substrate 300). Then, a wet etching process is performed to enlarge isotropically the primary recess to form the recess 360. In one embodiment of the present invention, the wet etching is performed by using an etchant including ammonium hydroxide ($NH_4OH$) or tetramethylammonium hydroxide (TMAH). It is appreciated that the method of forming the recess 360 is not limited to the above-described dry etching and wet etching steps, but can include other methods having one single etching step or multiple etching steps in combination with dry etching and/or wet etching. Moreover, in another one embodiment of the present invention, the recess 360 may have cross-section in various shapes, such as arc, hexagon (also known as sigma Σ) or octagon, but not limited thereto. However, the recess 360 with hexagonal cross-section is exemplified in the present embodiment.

Figure 3:
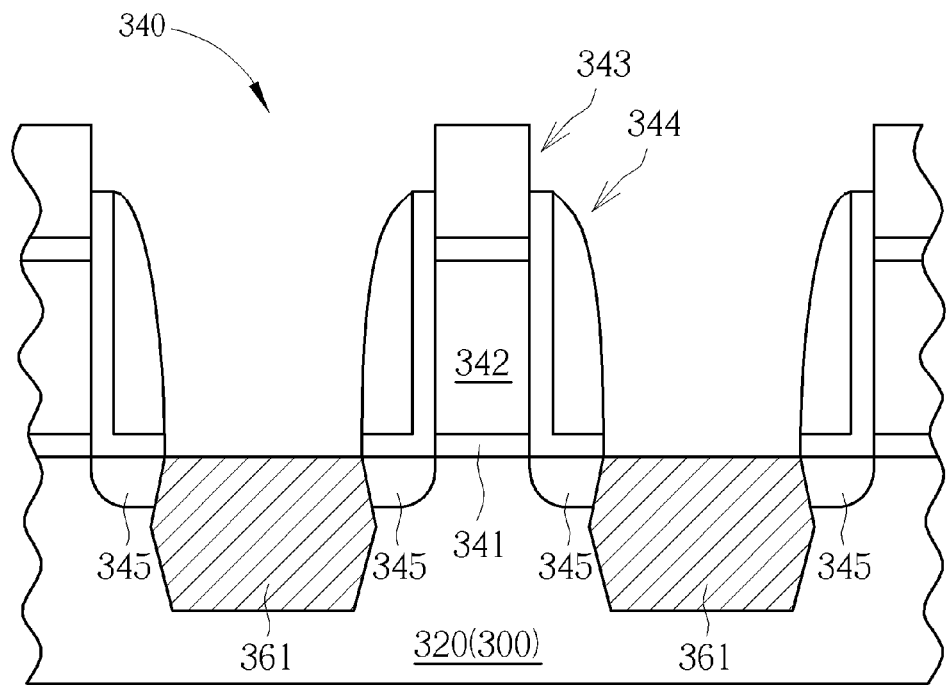

After these, as shown in FIG. 3, a selective epitaxial growth (SEG) process is performed to form an epitaxial structure 361 in the recess 360. In the present embodiment, the epitaxial structure 361 may have a top surface level with a top surface of the fin-shaped structure 320, and preferably the epitaxial structure 361 may have a cross-section having the same shape to the recess 360, such as arc, hexagon (also known as sigma Σ) or octagon, but may also be other shapes. In a preferred embodiment of the present invention, the material of the epitaxial structure 361 may be adjusted according to the type of the MOS transistor. For example, when the MOS transistor is a PMOS, the epitaxial structure 361 may include SiGe, SiGeB, or SiGeSn. In another embodiment of the present invention, when the MOS transistor is NMOS, the epitaxial structure 361 may include SiC, SiCP, or SiP.

Besides, the epitaxial structure 361 may be formed by a SEG process through a single or a multiple layer approach, and the heterogeneous atoms (such as germanium or carbon atoms) may also be altered in a gradual arrangement, preferably with the surface of the epitaxial structure 361 having a relative lighter concentration or no germanium at all, to facilitate the subsequent formation of a silicide layer. Furthermore, although the epitaxial structure 361 of the present embodiment is exemplified as having the top surface level with the top surface of the fin-shaped structure 320, in another embodiment of the present invention, the epitaxial structure may also be extended over the top surface of the substrate 300.

Then, an ion implantation process is performed, to form a source/drain 360a at a portion of or whole epitaxial structure 361. However, in another embodiment, the formation of the source/drain 360a may also be in-situ formed while the SEG process. For example, when the MOS transistor is a PMOS, the epitaxial structure 361 includes SiGe, SiGeB or SiGeSn which may be doped in-situ with P type dopants to form a $P^+$ epitaxial structure thereby; or when the MOS transistor is a NMOS, the epitaxial structure 361 include SiC, SiCP or SiP which may be doped in-situ with N type dopants to form a $N^+$ epitaxial structure thereby. Thus, the following ion implantation process for forming the source/drain of PMOS/NMOS maybe omitted. Also, in another one embodiment of the present invention, the dopants of source/drain 360a may either be altered in a gradual arrangement.

Figure 4:
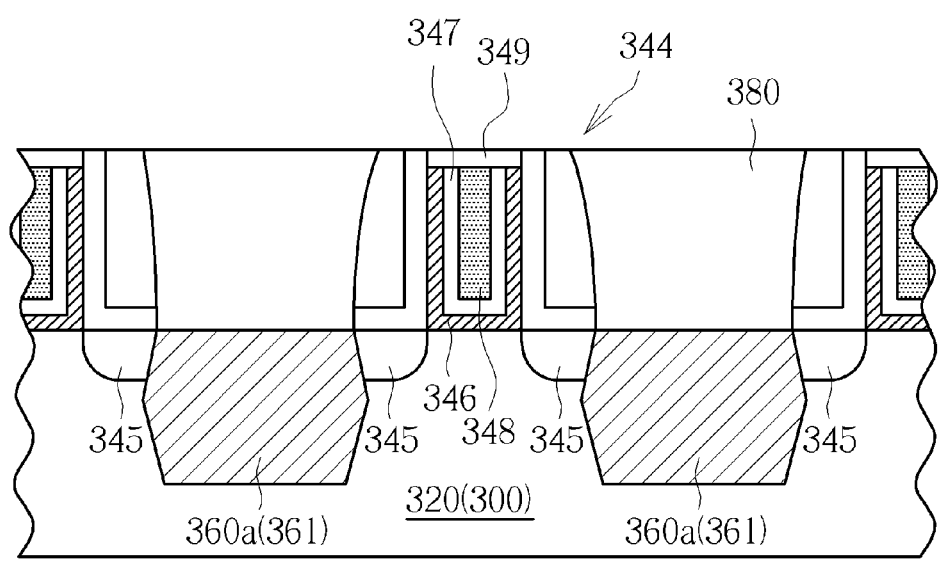

Next, as shown in FIG. 4, after forming an interlayer dielectric (ILD) layer 380 on the substrate 300 to cover the gate structure 340, a replacement metal gate process is performed to replace the dummy gate 342 with a metal gate. In the present embodiment, the method of forming the metal gate may include entirely forming an interlayer dielectric material layer (not shown in the drawings), such as a silicon oxide layer, on the substrate 300, to completely cover the gate structure 340. Then, a planarization process is carried out, such as a chemical mechanical polish (CMP) process, an etching back process or a combination of both, to sequentially remove a portion of the interlayer dielectric material layer and a portion of the spacer 344, and remove all of the capping layer 343 up to the exposure of the dummy gate 342. Subsequently, the dummy gate 342 and the interfacial layer 341 are removed by using a selective dry etching or wet etching, thereby forming a gate recess (not shown in the drawings) and the ILD layer 380. Finally, a gate dielectric material layer (not shown in the drawings), a work function metal material layer (not shown in the drawings), a metal gate material layer (not shown in the drawings) and a cap material layer (not shown in the drawings) are sequentially formed in the gate recess and another CMP process is carried out to remove the above layers that are outside the gate recess, and then to form a gate dielectric layer 346, a work function metal layer 347, a metal layer 348 and a cap layer 349 as shown in FIG. 4. In one embodiment of the present invention, a barrier layer (not shown in the drawings), such as a titanium (Ti) layer, a titanium nitride (TiN) layer, a tantalum (Ta) layer or a tantalum nitride (TaN) layer, maybe further formed between the work function metal layer 347 and the fin-shaped structure 320 of the substrate 300, but not limited thereto. Additionally, in another embodiment of the present invention, a contact etch stop layer (CESL; not shown in the drawings), for example a monolayer or composite layer, may also be optionally formed on the substrate 300 entirely to cover the metal gate, thereby providing required compressive stress or stretching stress to the metal gate.

In one embodiment of the present invention, the gate dielectric layer 346 for example includes silicon dioxide, silicon nitride, or high dielectric constant (high-k) material, and the work function metal layer 347 is preferably configured to adjust the work function of the metal gate and the material thereof may be adjusted according to the type of the MOS transistor. For example, when the MOS transistor is NMOS, the work function metal layer 347 may include metal materials having a work function being between 3.9 eV and 4.3 eV, such as TiAl, ZrAl, WAl, TaAl, HfAl or TiAlC, but not limited thereto; or when the MOS transistor is PMOS, the work function metal layer 347 may include metal materials having a work function being between 4.8 eV and 5.2 eV, such as TiN, TaN, or TaC, but not limited thereto. The metal layer 348 for example includes aluminum (Al), Ti, Ta, or tungsten (W), but not limited thereto. Furthermore, the metal gate structure of the present invention is not limited to be formed through the above-mentioned steps and materials but can include other methods and materials which are well known by one skilled in the arts and are not redundantly described hereafter. Also, in another embodiment of the present invention, when the primary gate structure may be adequate for the product requirements, the replacement metal gate process may also be omitted optionally.

Figure 5:
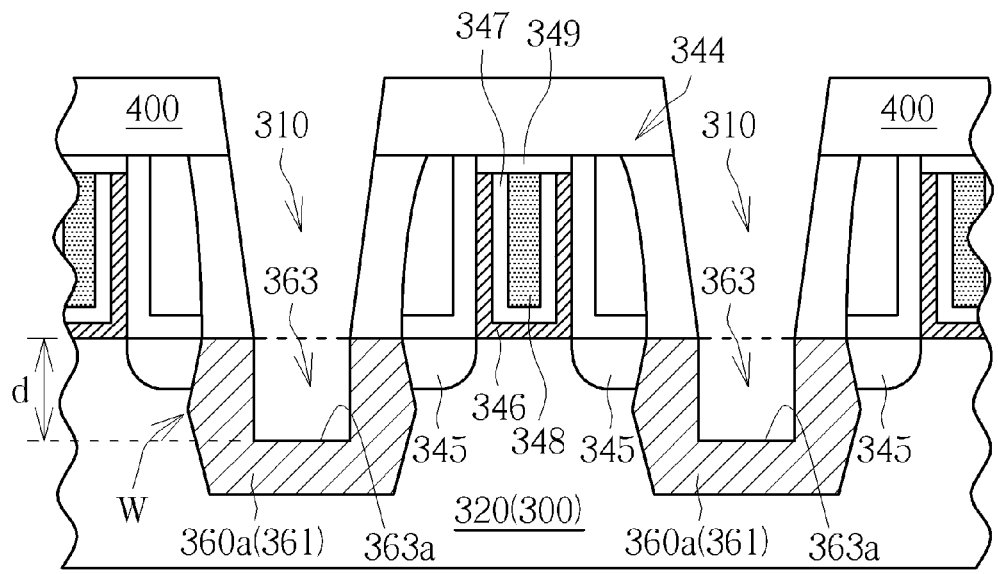

In the following, as shown in FIG. 5, a contact opening etching process is carried out. Precisely, a dielectric layer 400 is firstly formed on the ILD layer 380, and the dielectric layer 400 may include the same material to the ILD layer 380 or other suitable materials. Subsequently, at least one contact opening 310 is formed in the dielectric layer 400 and the ILD layer 380 to expose a portion of the epitaxial structure 361. The contact opening etching process for example includes performing a photolithographic etching process, by forming a patterned photoresist layer (not shown in the drawings) on the dielectric layer 400, and carrying out an etching process to partially remove the dielectric layer 400 and the ILD layer 380 at two sides of the gate structure 340, thereby forming a plurality of contact openings 310 to expose the portion of the epitaxial structure 361.

It is worth mentioning that, after performing the contact opening etching process of the present embodiment, the epitaxial structure 361 is further vertically downwardly etched through the contact opening 310, so as to form a recess 363 in the epitaxial structure 361, as shown in FIG. 5. It is noted that the recess 363 has a depth d preferably being 30% to 70% of a height of the epitaxial structure 361, so that a bottom surface 363a of the recess 363 may have a lowest portion lower than a widest portion of a cross-section of the epitaxial structure 361. After these, a pre-cleaning process may be carried out optionally, to remove the residue of the aforementioned photolithographic etching process remained in contact opening 310 and recess 363. However, in other embodiments of the present invention, the pre-cleaning process may also be omitted.

Figure 6:
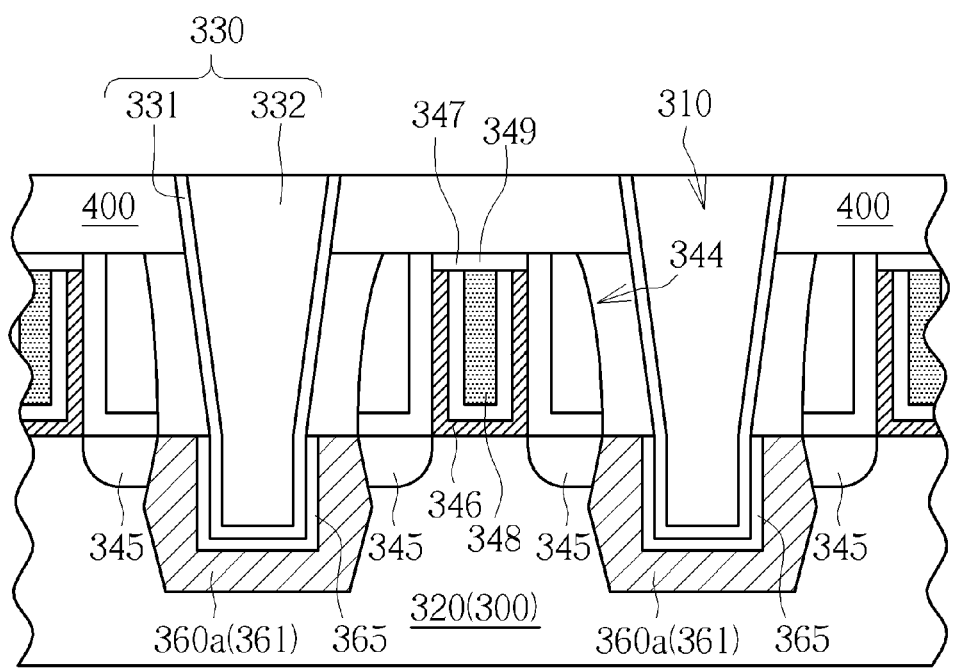

Turning next, as shown in FIG. 6, a silicidation process and a contact plug forming process are performed sequentially, to form a silicide layer 365 on the epitaxial structure 361 exposed by the contact opening 310, and form a contact plug 330 in the contact opening 310. Precisely speaking, the silicidation process of the present embodiment, for example includes conformally forming a metal layer (not shown in the drawings) in the contact opening 310 and the recess 363 firstly, wherein the metal layer may preferably include titanium, cobalt (Co), nickel (Ni), and platinum (Pt) or a composite material of the combination thereof, and more preferably titanium, but not limited thereto. Subsequently, an annealing process is performed to have the metal layer reacted with the epitaxial structure 361 to form the silicide layer 365, such as titanium silicide (TiSi), on the epitaxial structure 361. In the present embodiment, the annealing process may include a soak annealing process between 500° C. and 600° C., preferably 550° C., in which the duration thereof is preferably between 10 seconds to 60 seconds, and a spike annealing process between 600° C. and 950° C., preferably 600° C., in which the duration thereof is preferably between 100 milliseconds to 5 seconds. Finally, the unreacted metal layer is removed. However, the silicidation process of the present invention is not limited to be performed through the above-mentioned steps but can include other methods which are well known by one skilled in the arts. For example, in another embodiment, a first metal layer (not shown in the drawings), such as a titanium layer, and a second metal layer (not shown in the drawings), such as a titanium nitride may be formed sequentially, and the first metal layer and the second metal layer may be optionally removed after the annealing process. Otherwise, the second metal may also remain to function as a barrier layer of the contact plug.

After the silicide layer 365 is formed, the contact plug forming process is performed. Specifically, the contact plug 330 may be filled in the contact opening 310 and the recess 363, and which includes a barrier layer 331 and a contact metal layer 332. In one embodiment of the present invention, the barrier layer 331 for example may be a titanium layer, a titanium nitride layer, a tantalum layer or a tantalum nitride layer, and the contact metal layer 332 may be tungsten or other low resistance metal, but not limited thereto. It is worth mentioning that the barrier layer 331 of the present embodiment may directly contact the silicide layer 365 and the silicide layer 365 is formed on a surface of the epitaxial structure 361 and the recess 363, such that the contact area between the barrier layer 331 and the silicide layer 365 may dramatically increase, as shown in FIG. 6. In this case, the contact area between the contact metal layer 332 of the contact plug 330 and the silicide layer 365 may also increase accordingly, thereby reducing the resistance of the junction thereof and increasing the entire electric performance of the semiconductor device further.

Through the aforementioned steps, the semiconductor device according to the first embodiment of the present invention is provided. Moreover, after the contact plug 330 is formed, another metal interconnection system can be formed thereon subsequently, and the manufacturing method is well known in the arts and is not described hereafter. The method of manufacturing the semiconductor device of the present invention mainly forms the contact opening in the dielectric layer and further penetrates the contact opening to form the recess in the epitaxial structure formed in fin-shaped structure (substrate) at two sides of the gate structure during the contact opening etching process.

The following description will detail other different embodiments or variant embodiments of the manufacturing method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
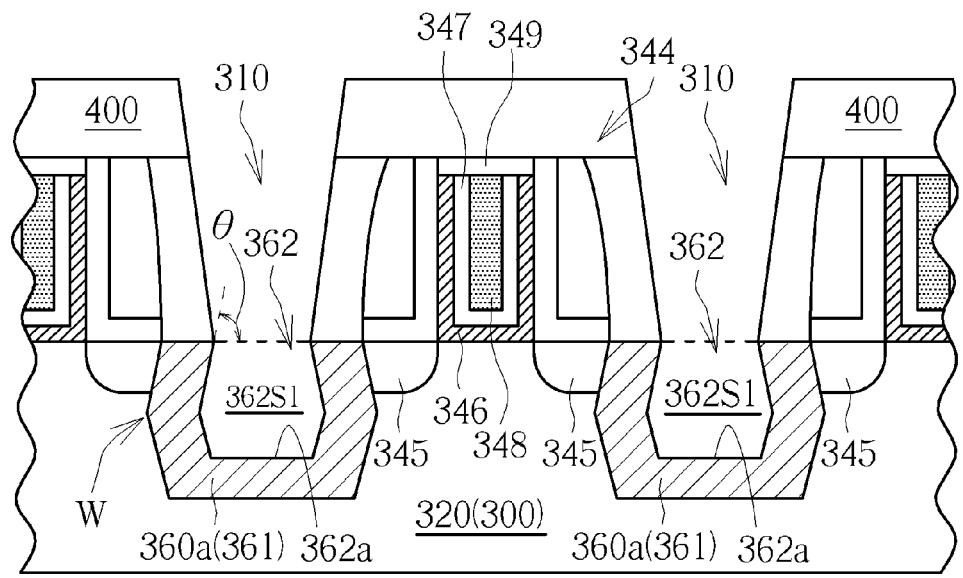
FIG. 7 to FIG. 8 are schematic diagrams illustrating a manufacturing method of a semiconductor device according to a second embodiment of the present invention.
Figure 8:
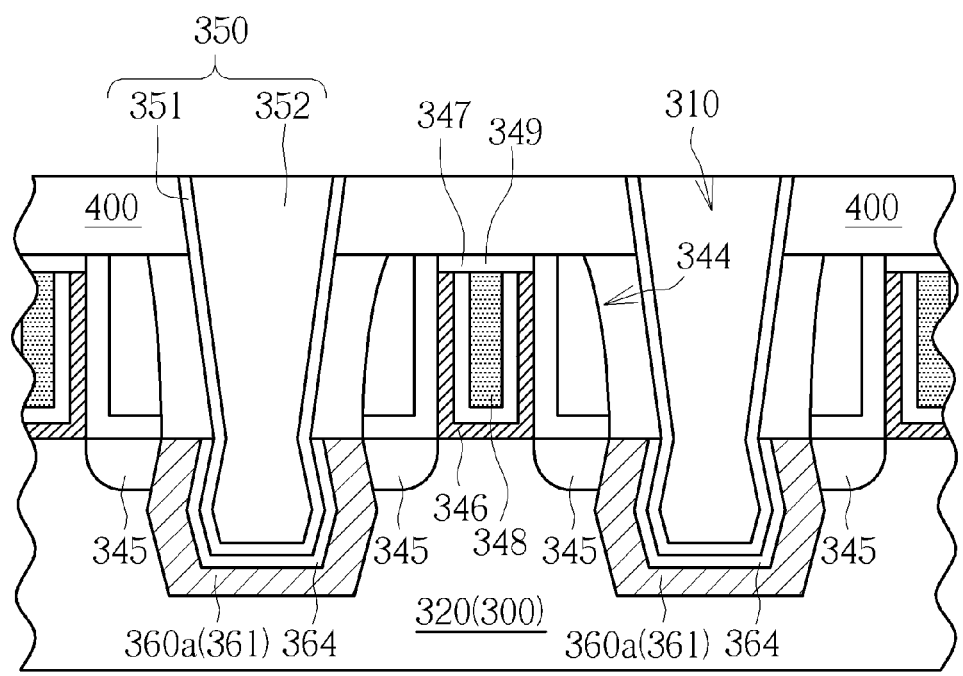

Please refer to FIGS. 7-8, which are schematic diagrams illustrating a manufacturing method of a semiconductor device according to the second embodiment of the present invention. The formal steps in the present embodiment are similar to those as in FIGS. 1-5 in the first embodiment and are not redundantly described herein. As shown in FIG. 7, the differences between the present embodiment and the aforementioned first embodiment are in that after forming the semiconductor structure shown in FIG. 5, the epitaxial structure 361 is further etched laterally, especially being laterally etched along a sidewall of the recess 363, to form a recess 362 having a sidewall being gradually expanded from an opening of the recess 362. Specifically, the laterally etching is performed along the <111>surface, and preferably along a direction having an angle between 50 degrees and 72 degrees (preferably 53 degrees) to the top surface of the substrate 300. In this case, there may be an angle θ formed between the sidewall of the recess 362 and the top surface of the substrate 300, and the angle θ is substantially between 50 degrees and 72 degrees, preferably 53 degrees. Thus, the recess 362 may have a cross-section 362S1 being gradually expanded from an opening thereof, such as a hexagon (also known as sigma Σ) shape, as shown in FIG. 7.

Figure 9:
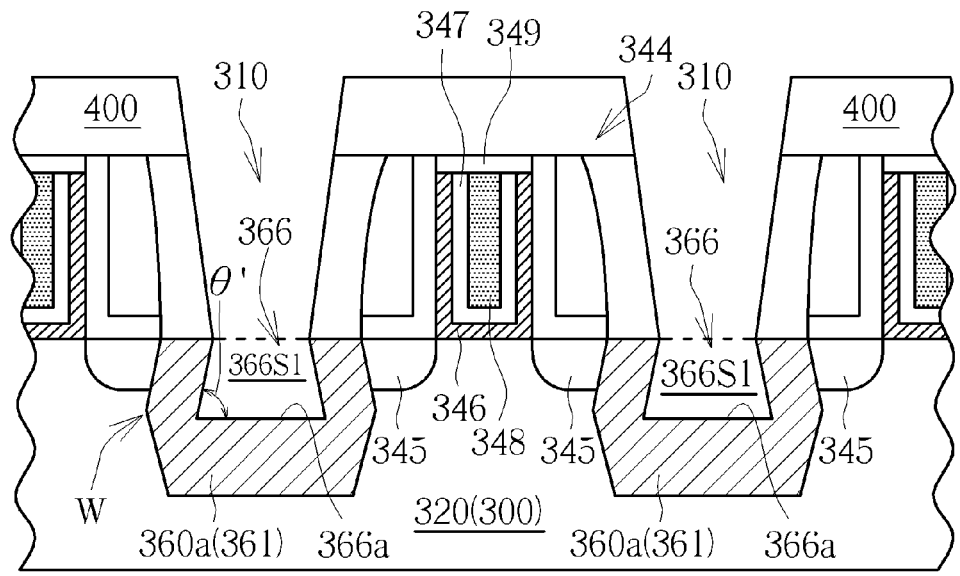
FIG. 9 is a schematic diagram illustrating a variant embodiment of the second embodiment of the present invention.
Figure 10:
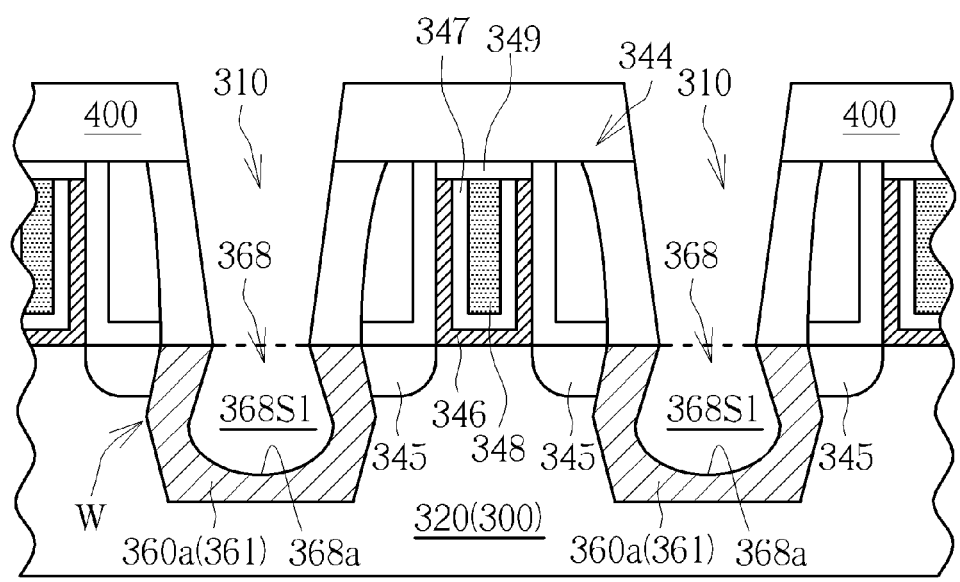
FIG. 10 is a schematic diagram illustrating another variant embodiment of the second embodiment of the present invention.

It is noted that the above-mentioned "cross-section 362S1" refers to a section of the recess 362 in a direction perpendicular to the substrate 300. In one embodiment of the present invention, the cross-section 362S1 of the recess 362 has a bottom surface 362a lower than the top surface of the substrate 300, and a lowest portion of the bottom surface 362a is preferably lower than a widest portion of a cross-section of the epitaxial structure 361, as shown in FIG. 7. In another embodiment of the present invention, through adjusting the etching ratio of the laterally etching, a recess 366 having a trapezoidal cross-section 366S1 as shown in FIG. 9 may also be formed. The cross-section 366S1 of the trench 366 has a bottom angle θ' substantially between 50 degrees and 72 degrees. Also, in another embodiment of the present invention, through further adjusting the etching ratio of the laterally etching, a recess 368 having irregular hexagon-like-shaped cross-section 368S1 as shown in FIG. 10 may also be formed accordingly. The cross-section 368S1 of the recess 368 may include an arc bottom surface 368a.

Then, similar to the aforementioned first embodiment, the silicidation process and the contact plug forming process are performed sequentially, to form a silicide layer 364 and a contact plug 350 as shown in FIG. 8. In the present embodiment, the silicide layer 364 may also be formed on a surface of the recess 362 in the epitaxial structure 361, thereby conformally performing a cross-section gradually expanded from an opening of the recess 362, such as in hexagon (also known as sigma Σ) shape. Accordingly, the contact area between the barrier layer 351 and the silicide layer 364 may be further increased. Likewise, in the embodiments shown in FIG. 7, FIG. 8, FIG. 9 and FIG. 10, it is illustrated that the laterally etching forms a particular angle, such as an acute angle, wherein the particular angle is substantially between 50 degrees and 72 degrees in one embodiment. In other words, at least a portion (particular to the portions adjust to the openings of the recesses) of the cross-sections 362S1, 366S1, 368S1 of the recesses 362, 366, 368 are gradually expanded from up to down, thereby increasing the contact area between the epitaxial structure 361 and the silicide layer 364 and/or the contact plug 350 (namely the contact metal layer 352). With such arrangement, the resistance of the junction between the epitaxial structure 361 and the silicide layer 364 (and/or the contact plug 350) may be dramatically reduced, so that the electric performance of the semiconductor device will be increased further. Thus, through the above-mentioned steps, the semiconductor device according to the second embodiment of the present invention is provided. Furthermore, it is also noted that except for the aforementioned differences, other steps of the present embodiment are all the same or similar to that of the first embodiment and will not be redundantly described.

Additionally, although the aforementioned embodiments are exemplified as a "gate-last" process and a "high-k last" process, in another embodiment, the semiconductor device of the present invention may also be formed through a "gate-first" process or a "high-k first" process. Otherwise, although the aforementioned embodiments are mainly applied on a method of manufacturing a non-planar transistor, the present invention may also be used on a method of manufacturing other planar transistors. For example, the fin-shaped structure may be omitted, and the gate structure, epitaxial structure and other elements maybe formed directly on the planar substrate which is well known by one skilled in the arts.

In summary, the present invention provides a semiconductor device and a method of manufacturing the same. Through the method of manufacturing the semiconductor device, the contact opening is formed in the dielectric layer firstly, and the recess is then formed in the epitaxial structure in fin-shaped structure (substrate) at two sides of the gate structure by penetrating through the contact opening during the contact opening etching process. Thus, the recess may have a hexagon shape, a trapezoid shape or an irregular shape. With such arrangement, the silicide layer may be formed subsequently on the inner surface of the recess, so as to increase the contact area between the contact plug and the silicide layer, and to efficiently reduce the resistance between the contact plug and the silicide layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   forming a first recess in a substrate;
   forming an epitaxial structure in the first recess;
   forming a dielectric layer on the substrate;
   forming a contact opening in the dielectric layer;
   forming a second recess in the epitaxial structure through the contact opening, wherein the second recess has a depth being 30% -70% of a height of the epitaxial structure and has a cross-section along a direction perpendicular to the substrate and at least a portion of the cross-section is gradually expanded from an opening of the second recess; and performing a silicidation process to form a silicide layer on a surface of the second recess.

2. The manufacturing method of the semiconductor device of claim 1, wherein the forming of the second recess comprises:

vertically etching the epitaxial structure to form a third recess; and laterally etching a sidewall of the third recess to form the second recess.

3. The manufacturing method of the semiconductor device of claim 1, further comprising:

providing a fin-shaped structure, the fin-shaped structure being formed in the substrate and the first recess being formed in the fin-shaped structure.

4. A semiconductor device, comprising:

a substrate;

an epitaxial structure disposed in the substrate;

a recess disposed in the epitaxial structure, wherein the recess has a depth being 30%-70% of a height of the epitaxial structure and has a cross-section along a direction perpendicular to the substrate and at least a portion of the cross-section is gradually expanded from an opening of the recess; and a contact plug disposed on the substrate, wherein a portion of the contact plug is encompassed by the epitaxial structure.

5. The semiconductor device of claim 4, wherein the cross-section of the recess has a bottom surface lower than a top surface of the substrate.

6. The semiconductor device of claim 5, wherein the cross-section of recess has a sidewall, and there is an angle between the sidewall and the top surface of the substrate being between 50 degrees and 72 degrees.

7. The semiconductor device of claim 4, wherein the cross-section of the recess has a bottom surface, and a lowest portion of the bottom surface is lower than a widest portion a cross-section of the epitaxial structure.

8. The semiconductor device of claim 7, wherein the bottom surface is an arc bottom surface.

9. The semiconductor device of claim 4, wherein the cross-section of the recess has a trapezoid shape or a hexagon shape.

10. The semiconductor device of claim 4, further comprising:

a silicide layer disposed on a surface of the recess.

11. The semiconductor device of claim 10, further comprising:

a dielectric layer disposed on the substrate; and the contact plug disposed in the dielectric layer and electrically connected the epitaxial structure.

12. The semiconductor device of claim 11, wherein the silicide layer is disposed between the contact plug and the epitaxial structure.

13. The semiconductor device of claim 10, wherein the silicide layer comprises titanium silicide.

14. The semiconductor device of claim 4, further comprising:

a fin-shaped structure, wherein the epitaxial structure is disposed in the fin-shaped structure.

15. A semiconductor device, comprising:

a substrate;

an epitaxial structure disposed in the substrate;

a recess disposed in the epitaxial structure, wherein the recess has a trapezoid shape and has a depth being 30-70% of a height of the epitaxial structure; and a contact plug disposed on the substrate, wherein a portion of the contact plug is encompassed by the epitaxial structure.

16. The semiconductor device of claim 15, further comprising:

a silicide layer disposed on a surface of the recess.

17. The semiconductor device of claim 15, wherein a cross-section of the recess has a bottom surface, and a lowest portion of the bottom surface is lower than a widest portion a cross-section of the epitaxial structure.

* * * * *